(12) United States Patent
Tagaki et al.

(10) Patent No.: US 11,134,249 B2
(45) Date of Patent: Sep. 28, 2021

(54) BINARY ARITHMETIC DECODER AND BINARY ARITHMETIC DECODING DEVICE

(71) Applicant: NTT Electronics Corporation, Yokohama (JP)

(72) Inventors: Manabu Tagaki, Yokohama (JP); Takashi Matsumoto, Yokohama (JP)

(73) Assignee: NTT Electronics Corporation, Kanagawa (JP)

(*) Notice: Subject to any disclaimer, the term of this patent is extended or adjusted under 35 U.S.C. 154(b) by 0 days.

(21) Appl. No.: 16/492,280

(22) PCT Filed: Mar. 14, 2018

(86) PCT No.: PCT/JP2018/009888
§ 371 (c)(1),
(2) Date: Sep. 9, 2019

(87) PCT Pub. No.: WO2018/168901
PCT Pub. Date: Sep. 20, 2018

(65) Prior Publication Data
US 2020/0396457 A1 Dec. 17, 2020

(30) Foreign Application Priority Data
Mar. 15, 2017 (JP) .............................. JP2017-049546

(51) Int. Cl.
*H04N 19/13* (2014.01)
*H04N 19/149* (2014.01)
(Continued)

(52) U.S. Cl.
CPC ............. *H04N 19/13* (2014.11); *G06F 17/18* (2013.01); *H04N 19/149* (2014.11); *H04N 19/184* (2014.11); *H04N 19/44* (2014.11)

(58) Field of Classification Search
None
See application file for complete search history.

(56) References Cited

U.S. PATENT DOCUMENTS 7,821,430 B2 * 10/2010 Sakaguchi .......... H03M 7/4006
341/107
8,422,552 B2 * 4/2013 Au ...................... H03M 7/4006
375/240.02
(Continued)

FOREIGN PATENT DOCUMENTS

JP 2005-130099 A 5/2005
JP 2008-118304 A 5/2008
(Continued)

OTHER PUBLICATIONS

Recommendation ITU-: H.264 "Advanced Video Coding for Generic Audiovisual Services", Edition 8.0, Apr. 13, 2013.
(Continued)

*Primary Examiner* — Chikaodili E Anyikire
(74) *Attorney, Agent, or Firm* — Kilpatrick Townsend & Stockton LLP

(57) ABSTRACT

A binary arithmetic device includes an LPS/MPS determining unit that determines, using a context variable, a range length, and an offset, whether a code is an inferior probability code or a superior probability code, a renormalization processing unit that performs renormalization processing on the range length and the offset, and a context-variable calculating unit that derives the binary data of the code using a determination result and updates the context variable according to the determination result. The renormalization processing unit 15 includes a first renormalizing unit and a second renormalizing unit and a selecting unit that selects, according to the determination result, an output of the first renormalizing unit or an output of the second renormalizing unit.

5 Claims, 10 Drawing Sheets

(51) Int. Cl.
*H04N 19/184* (2014.01)
*H04N 19/44* (2014.01)
*G06F 17/18* (2006.01)

(56) References Cited

U.S. PATENT DOCUMENTS

| | | | |
|---|---|---|---|
| 10,264,264 B2 * | 4/2019 | Banerjee | H04N 19/13 |
| 2005/0088324 A1 * | 4/2005 | Fuchigami | H03M 7/4006 |
| | | | 341/107 |
| 2006/0220927 A1 * | 10/2006 | Park | H03M 7/4006 |
| | | | 341/50 |
| 2008/0100479 A1 * | 5/2008 | Otsuka | H03M 7/4006 |
| | | | 341/60 |
| 2008/0100480 A1 * | 5/2008 | Otsuka | H03M 7/4006 |
| | | | 341/60 |
| 2009/0089549 A1 * | 4/2009 | Liu | H04N 19/44 |
| | | | 712/208 |
| 2009/0219183 A1 * | 9/2009 | Sakaguchi | H03M 7/4006 |
| | | | 341/107 |
| 2010/0134330 A1 | 6/2010 | Sakaguchi | |
| 2013/0003858 A1 * | 1/2013 | Sze | H04N 19/122 |
| | | | 375/240.18 |
| 2016/0043735 A1 * | 2/2016 | Zhou | H04N 19/13 |
| | | | 341/107 |

FOREIGN PATENT DOCUMENTS

| | | |
|---|---|---|
| JP | 2009-207029 A | 9/2009 |
| JP | 2010-130407 A | 6/2010 |
| JP | 2011-501896 A | 1/2011 |

OTHER PUBLICATIONS

International Search Report, PCT Patent Application No. PCT/JP2018/009888, dated Jun. 12, 2018.
European Patent Application No. 18767134.2, Extended European Search Report, dated Nov. 26, 2020, 9 pages.
Yu et al., "A High Performance CABAG Decoding Architecture", IEEE Transactions On Consumer Electronics, vol. 51, Issue 4, Nov. 1, 2005, pp. 1352-1359.

* cited by examiner

FIG. 2

LPS SECTION LENGTH TABLE

| qStateIdx | qRangeIdx | | | |
|---|---|---|---|---|
| | 0 | 1 | 2 | 3 |
| 0 | 128 | 176 | 208 | 240 |
| 1 | 128 | 167 | 197 | 227 |
| 2 | 128 | 158 | 187 | 216 |
| 3 | 123 | 150 | 178 | 205 |
| 4 | 116 | 142 | 169 | 195 |
| 5 | 111 | 135 | 160 | 185 |
| 6 | 105 | 128 | 152 | 175 |
| 7 | 100 | 122 | 144 | 166 |
| 8 | 95 | 116 | 137 | 158 |
| 9 | 90 | 110 | 130 | 150 |

⋮

| | | | | |
|---|---|---|---|---|
| 60 | 6 | 8 | 9 | 11 |
| 61 | 6 | 7 | 9 | 10 |
| 62 | 6 | 7 | 8 | 9 |
| 63 | 2 | 2 | 2 | 2 | pStateIdx : INDEX INDICATING SYMBOL OCCURRENCE PROBABILITY
qRangeIdx : VALUE OF 2 BITS CORRESPONDING TO [7:6] IN RANGE LENGTH CONSISTING OF TOTAL 9 BITS

FIG. 3 pStateIdx TRANSITION TABLE

| pStateIdx | transIdxLps | transIdxMps |
|---|---|---|
| 0 | 0 | 1 |
| 1 | 0 | 2 |
| 2 | 1 | 3 |
| 3 | 2 | 4 |
| 4 | 2 | 5 |
| 5 | 4 | 6 |
| 6 | 4 | 7 |
| 7 | 5 | 8 |
| 8 | 6 | 9 |
| 9 | 7 | 10 |
| ⋮ | ⋮ | ⋮ |
| 60 | 37 | 61 |
| 61 | 38 | 62 |
| 62 | 38 | 62 |
| 63 | 63 | 63 | pStateIdx : INDEX INDICATING SYMBOL OCCURRENCE PROBABILITY
transIdxLps : pStateIdx TO WHICH pStateIdx SHOULD BE TRANSITIONED WHEN SYMBOL OF LPS IS GENERATED
transIdxMps : pStateIdx TO WHICH pStateIdx SHOULD BE TRANSITIONED WHEN SYMBOL OF MPS IS GENERATED

BINARY ARITHMETIC DECODER AND BINARY ARITHMETIC DECODING DEVICE

TECHNICAL FIELD

The present invention relates to a technique for decoding encoded data encoded by context-adaptive binary arithmetic coding.

BACKGROUND ART

In moving image encoding techniques such as H.264/AVC and H.265/HEVC, context-adaptive binary arithmetic coding (CABAC), which is a type of entropy coding, is used (Non-patent document 1).

In a decoding device that decodes an encoded video, a binary arithmetic decoder (a CABAC decoder) that decodes data encoded by the CABAC is provided (Patent documents 1 and 2).

PRIOR ART DOCUMENT

Patent Document

Patent document 1: Japanese Laid-open Patent Publication No. 2010-130407
Patent document 2: Japanese National Publication of International Patent Application No. 2011-501896

Non-Patent Document

Non-patent document 1: Recommendation ITU-T H.264 "Advanced video coding for generic audiovisual services", Edition 8.0 (2013 Apr. 13)

SUMMARY OF THE INVENTION

Problem to be Solved by the Invention

In order to decode encoded data at higher speed, CABAC decoding processing also needs to be performed at high speed and efficiently. The conventional CABAC decoders described in Patent documents 1 and 2 perform sequential processing in which the CABAC decoders perform LPS/MPS determination processing for an input code and thereafter perform renormalization processing.

As the renormalization processing, processing for repeating a large number of renormalization processing loops needs to be performed in some case. The number of times of the repeated renormalization processing loops varies depending on input encoded data, an index indicating a symbol occurrence probability at a point in time of decoding, and a value of range length or the like. The renormalization processing loops are repeated as many as seven times. Therefore, it is likely that a long processing time is required for the renormalization processing. It is difficult to increase the speed of the decoding processing.

The present invention has been made in view of the problems described above, and an objective of the present invention is to realize an increase in speed and improvement of efficiency of the CABAC decoding processing.

Means for Solving the Problem

A binary arithmetic decoder according to an aspect of the present invention to solve the problem above includes: a binary-arithmetic-decoding processing unit that decodes input encoded data into binary data and outputs the binary data; a multi-value unit that converts the binary data output by the binary-arithmetic-decoding processing unit into multi-value data and outputs the multi-value data; and a context-index calculating unit that derives a context index based on the decoded binary data and the multi-value data and outputs the context index to the binary-arithmetic-decoding processing unit. The binary-arithmetic-decoding processing unit includes: a context-variable retaining unit that derives, based on the context index output from the context-index calculating unit, a first context variable included a first probability state index representing a code occurrence probability and a value of a first superior probability code having a high occurrence probability and retains the first context variable; a range-length/offset-variable retaining unit that retains a range length indicating an entire section length in a real number section of an occurrence probability and an offset indicating a present position in the range length; a first LPS/MPS determining unit that determines, using the first probability state index, the range length, and the offset, whether a code of first binary data is an inferior probability code or a superior probability code and outputs a result of the determination; a first renormalization processing unit that performs renormalization processing on the range length and the offset; and a context-variable calculating unit that derives the first binary data using the first context variable and the determination result and outputs the first binary data to the multi-value unit. The first renormalization processing unit: in parallel to determination processing of the first LPS/MPS determining unit, regards the code of the first binary data as the inferior probability code, updates the range length and the offset, and performs first renormalization processing on the range length and the offset after the update until the range length after the update becomes a predetermined section length or more, in parallel to the determination processing of the first LPS/MPS determining unit, regards the code of the first binary data as the superior probability code, updates the range length and the offset, and performs second renormalization processing on the range length and the offset after the update until the range length after the update becomes a predetermined section length or more, and selects, according to the determination result, the range length and the offset after renormalization by the first renormalization processing or the range length and the offset after renormalization by the second renormalization processing and outputs the range length and the offset to the range-length/offset-variable retaining unit.

A binary arithmetic decoding device according to an aspect of the present invention is a device that decodes input encoded data into binary data and outputs the binary data, the binary arithmetic decoding device including: a first LPS/MPS determining unit that determines, using a first context variable, a range length indicating an entire section length in real number section of an occurrence probability, and an offset indicating a present position in the range length, whether a code of first binary data is an inferior probability code or a superior probability code and outputs a result of the determination; a first renormalization processing unit that performs renormalization processing on the range length and the offset; and a context-variable calculating unit that derives the first binary data using the determination result and updates the first context variable according to the determination result. The first renormalization processing unit includes: a first renormalizing unit that, in parallel to determination processing of the first LPS/MPS determining unit, regards the code of the first binary data as the inferior probability code and performs renormalization processing; a second renormalizing unit that, in parallel to the determination processing of the first LPS/MPS determining unit, regards the code of the first binary data as the superior probability code and performs renormalization processing; and a selecting unit that selects, according to the determination result, the range length and the offset after the renormalization by the first renormalizing unit or the range length and the offset after the renormalization by the second renormalizing unit and the selected range length and offset.

Effect of the Invention

According to the present invention, it is possible to realize an increase in speed and improvement of efficiency of the CABAC decoding processing.

BRIEF DESCRIPTION OF THE DRAWINGS

FIG. 2 is a diagram showing an example of an LPS section length table.
FIG. 3 is a diagram showing an example of a pStateIdx transition table.

MODE FOR CARRYING OUT THE INVENTION

Embodiments of the present invention are explained below with reference to the drawings.

First Embodiment

Configuration of a CABAC Decoder

Figure 1:
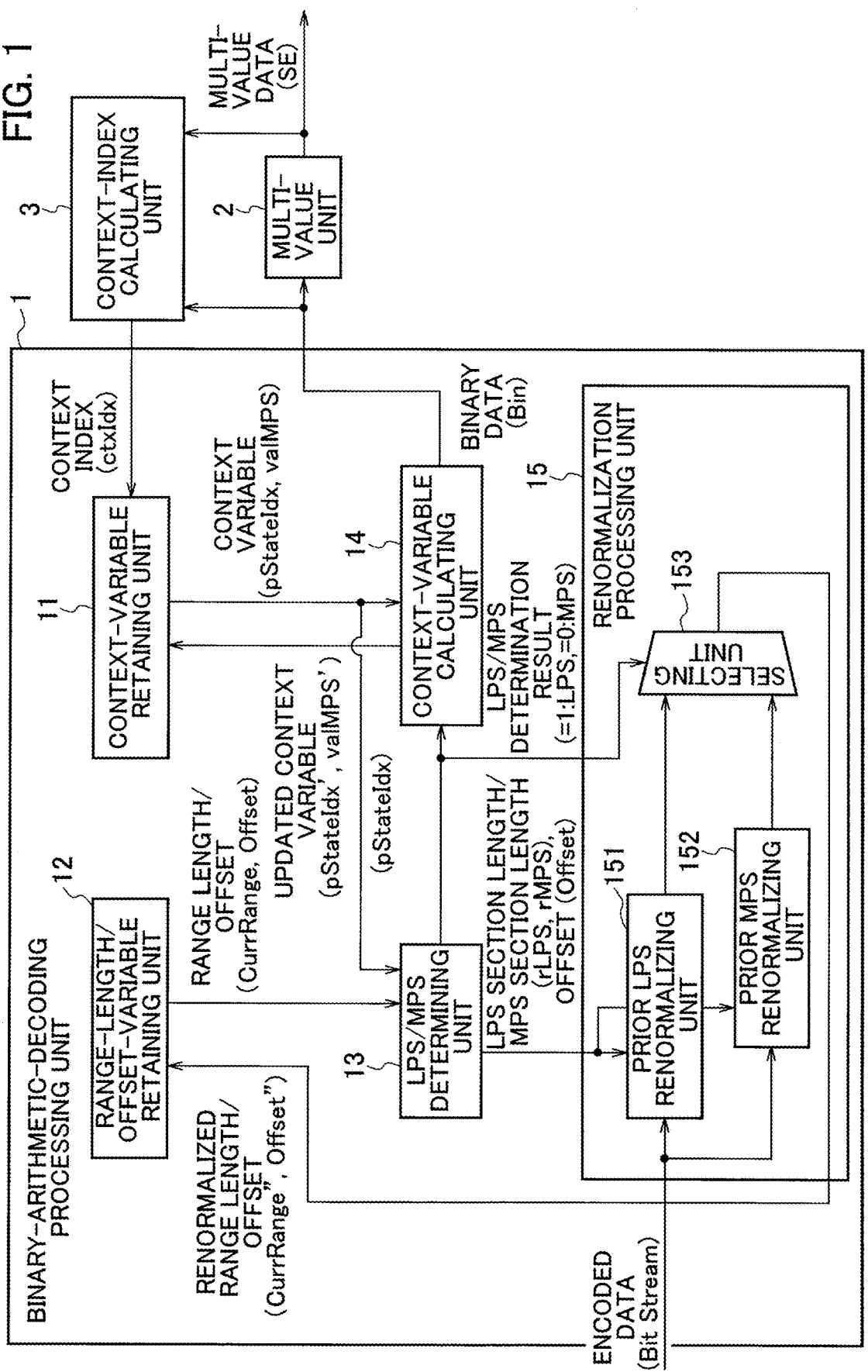
FIG. 1 is a diagram showing the configuration of a CABAC decoder according to a first embodiment.

FIG. 1 is a diagram for explaining the configuration of a CABAC decoder according to a first embodiment of the present invention. The CABAC decoder includes a binary-arithmetic-decoding processing unit 1, a multi-value unit 2, and a context-index calculating unit 3.

The binary-arithmetic-decoding processing unit 1 decodes input encoded data (Bit Stream) into binary data (Bin) and outputs the binary data to the multi-value unit 2. The multi-value unit 2 converts the binary data output by the binary-arithmetic-decoding processing unit 1 into multi-value data (a syntax element SE) and outputs the multi-value data. The context-index calculating unit 3 calculates a context index (ctxIdx) referring to binary data decoded before and the syntax element and supplies the context index (ctxIdx) to the binary-arithmetic-decoding processing unit 1. When decoding one symbol, the binary-arithmetic-decoding processing unit 1 derives a context variable context[ctxIdx] based on ctxIdx received from the context-index calculating unit 3. The binary-arithmetic-decoding processing unit 1 decodes the symbol into Bin based on derived context [ctxIdx].

The context variable context[ctxTdx] includes a probability state index pStateIdx representing a symbol occurrence probability and valMPS representing a superior probability symbol (MPS: Most Probable Symbol) having a high occurrence probability. pStateIndx represents, with probability states of 0 to 63 defined in advance, an estimated value of an occurrence probability of an inferior probability symbol (LPS: Least Probable Symbol) in the context. Note that a relation between values of an LPS and an MPS is valLPS=1−valMPS. Both of valMPS and valLPS are values of 0 or 1.

The binary-arithmetic-decoding processing unit 1 shown in FIG. 1 includes a context-variable retaining unit 11, a range-length/offset-variable retaining unit 12, an LPS/MPS determining unit 13, a context-variable calculating unit 14, and a renormalization processing unit 15.

The context-variable retaining unit 11 includes a context variable conversion table for deriving a context variable context[ctxTdx] from a context index ctxIdx. The context-variable retaining unit 11 retains (stores) values of pStateIdx and valMPS configuring context[ctxIdx] used for decoding.

The range-length/offset-variable retaining unit 12 retains values of a range length CurrRange and offset Offset used for determining whether a symbol of Bin to be decoded is an LPS or an MPS. Note that the range length CurrRange indicates a present entire section length in a real number section (0 to 1) of an occurrence probability. The offset (Offset) indicates a present position within the range length.

The LPS/MPS determining unit 13 includes an LPS section length table shown in FIG. 2 and determines whether a symbol of Bin to be decoded is an LPS or an MPS using pStateIdx retained by the context-variable retaining unit 11 and CurrRange and Offset retained by the range-length/offset-variable retaining unit 12. The LPS section length table shown in FIG. 2 is a table for deriving an LPS section length from two bits qRangeIdx and pStateIdx of [7:6] among total 9 bits [8:0] of CurrRange.

When performing the LPS/MPS determination, the LPS/MPS determining unit 13 derives, referring to the LPS section length table, an LPS section length rLPS from qRangeIdx and pStateIdx indicating two bits of [7:6] among total 9 bits [8:0] of captured CurrRange. The LPS/MPS determining unit 13 subtracts the LPS section length from a range length at the present point in time (CurrRange−rLPS) to calculate an MPS section length rMPS.

In this embodiment, the LPS/MPS determining unit 13 outputs a determination result related to the LPS/MPS determination, the LPS section length rLPS, the MPS section length rMPS, and Offset to the renormalization processing unit 15. When, as the LPS/MPS determination result, for example, a symbol to be decoded is an LPS, the LPS/MPS determining unit 13 outputs a bit 1. When, as the LPS/MPS determination result, for example, the symbol to be decoded is an MPS, the LPS/MPS determining unit 13 outputs a bit 0. The LPS/MPS determining unit 13 outputs the LPS/MPS determination result to the context-variable calculating unit 14.

The context-variable calculating unit 14 derives binary data Bin from the LPS/MPS determination result output by the LPS/MPS determining unit 13 and outputs the binary data Bin to the multi-value unit 2. The context-variable calculating unit 14 includes a pStateIdx transition table shown in FIG. 3 and updates, according to the pStateIdx transition table and the LPS/MPS determination result, the context variables (pStateIdx and valMPS) retained by the context-variable retaining unit 11. The pStateIdx transition table is a table for deriving transIdxLps, which is pStateIdx to which pStateIdx should be transitioned when an LPS is generated, and transIdxMps, which is pStateIdx to which pStateIdx should be transitioned when an MPS is generated.

The renormalization processing unit 15 performs renormalization procession on CurrRange and Offset. That is, the renormalization processing unit 15 increases CurrRange and Offset such that CurrRange used for the LPS/MPS determination is maintained at a predetermined section length or more (until CurrRange becomes a predetermined section length or more). The renormalization processing unit 15 captures encoded data bit by bit as Offset is doubled (one-bit left shifted).

The renormalization processing unit 15 in this embodiment includes a prior LPS renormalizing unit 151, a prior MPS renormalizing unit 152, and a selecting unit 153. The prior LPS renormalizing unit 151 and the prior MPS renormalizing unit 152 respectively capture rLPS, rMPS, and Offset output by the LPS/MPS determining unit 13. Note that the prior LPS renormalizing unit 151 and the prior MPS renormalizing unit 152 may capture Offset directly from the range-length/offset-variable retaining unit 12 rather than from the LPS/MPS determining unit 13. The selecting unit 153 captures an LPS/MPS determination result output by the LPS/MPS determining unit 13.

Note that the entire LPS section length table shown in FIG. 2 is disclosed in, for example, Table 9-44 (Specification of rangeTabLPS depending on pStateIdx and qCodIRangeIdx) of Non-patent document 1. The entire pStateIdx transition table shown in FIG. 3 is disclosed in Table 9-45 (State transition table) of the document.

Operation of the CABAC Decoder

Figure 4:
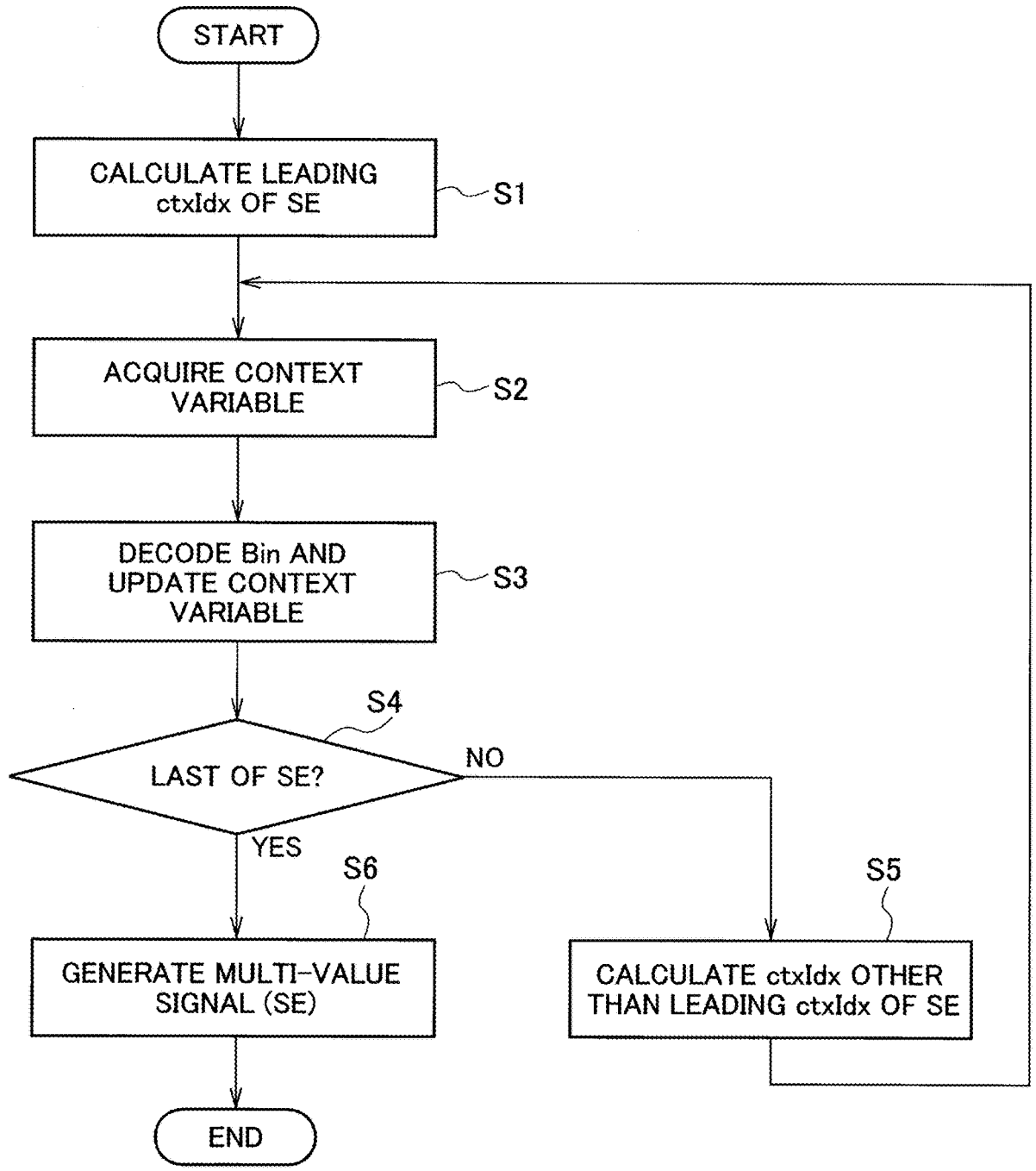
FIG. 4 is a processing flow showing processing of the CABAC decoder.

FIG. 4 is a processing flow showing processing of the CABAC decoder shown in FIG. 1.

[S1] First, the context-index calculating unit 3 calculates a leading context index ctxIdx of the syntax element SE.

[S2] The context-variable retaining unit 11 of the binary-arithmetic-decoding processing unit 1 acquires ctxIdx from the context-index calculating unit 3, derives a context variable context[ctxIdx] referring to a contact variable conversion table, and retains values of pStateIdx and valMPS, which are the context variable.

[S3] The binary-arithmetic-decoding processing unit 1 decodes input encoded data into the binary data Bin based on the derived context[ctxIdx]. The binary-arithmetic-decoding processing unit 1 updates context[ctxIdx] based on a decoding result of Bin and retains updated context[ctxIdx]. Processing of step S3 performed by the binary-arithmetic-decoding processing unit 1 is explained in detail below.

[S4] The multi-value unit 2 determines, referring to a variable length code table, whether last ctxIdx of the syntax element SE is calculated. [S5] When the multi-value unit 2 determines that last ctxIdx of the syntax element SE is not calculated, the context-index calculating unit 3 calculates next ctxIdx and the processing returns to the processing of step S2. [S6] When determining that last ctxIdx is calculated, the binary unit 2 outputs the SE as multi-value data.

Figure 5:
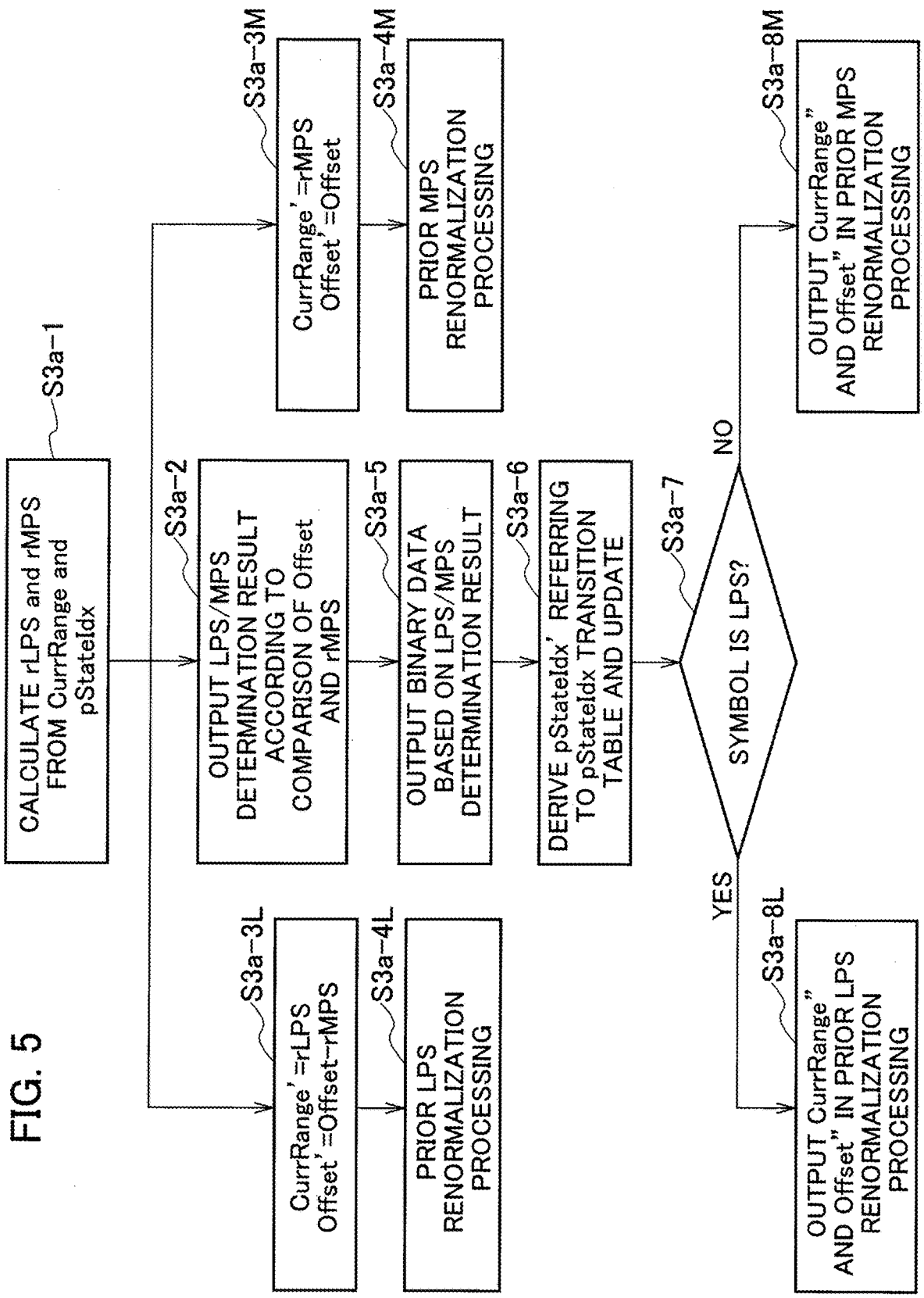
FIG. 5 is a processing flow for explaining detailed processing of step S3 in FIG. 4.

FIG. 5 is a diagram for explaining detailed processing of step S3 in FIG. 4 and is also a diagram for explaining a processing flow of the binary-arithmetic-decoding processing unit 1 in FIG. 1.

[S3a-1] The LPS/MPS determining unit 13 captures a range length CurrRange and an offset Offset at the present point in time retained by the range-length/offset-variable retaining unit 12 and captures pStateIdx retained by the context-variable retaining unit 11. The LPS/MPS determining unit 13 derives, referring to the LPS section length table shown in FIG. 2, an LPS section length rLPS from qRangeIdx and pStateIdx indicating two bits of [7:6] among total 9 bits [8:0] of captured CurrRange. The LPS/MPS determining unit 13 subtracts the LPS section length from a range length at the present point in time (CurrRange−rLPS) to calculate an MPS section length rMPS. The LPS/MPS determining unit 13 outputs rLPS, rMPS, and Offset to the renormalization processing unit 15.

[S3a-2] The LPS/MPS determining unit 13 compares sizes of the MPS section length rMPS and Offset and determines whether a symbol of Bin to be decoded is an LPS or an MPS. When rMPS is larger than Offset, the LPS/MPS determining unit 13 determines that the symbol of Bin is an MPS and outputs a bit 0 to the selecting unit 153 of the renormalization processing unit 15 as an LPS/MPS determination result. On the other hand, when rMPS is smaller than or equal to Offset, the LPS/MPS determining unit 13 determines that the symbol of Bin is an LPS and outputs a bit 1 to the selecting unit 153 of the renormalization processing unit 15 as the LPS/MPS determination result.

[S3a-3L to S3a-4L] Processing of step S3a-3L to step S3a-4L is performed independently from and in parallel to step S3a-2. Step S3a-3L to step S3a-4L are processing for performing renormalization processing assuming that the symbol of Bin is an LPS.

[S3a-3L] The prior LPS renormalizing unit 151 captures a value of rLPS output by the LPS/MPS determining unit 13 in step S3a-1 and sets the value as an updated range length CurrRange'. The prior LPS renormalizing unit 151 captures values of rMPS and Offset output by the LPS/MPS determining unit 13 in step S3a-1 and sets a value obtained by subtracting rMPS from Offset (Offset-rMPS) as an updated offset Offset'.

[S3a-4L] The prior LPS renormalizing unit 151 performs the renormalization processing using values of CurrRange' and Offset' set in step S3a-3L and calculates a renormalized range length CurrRange' and a renormalized offset Offset'. Specific processing of the renormalization processing is explained below.

[S3a-3M to S3a-4M] Processing in step S3a-3M to step S3a-4M is performed independently from and in parallel to step S3a-2 and performed independently from and in parallel to the processing in step S3a-3L to step S3a-4L. Steps S3a-3M to S3a-4M are processing for performing the renormalization processing assuming that the symbol of Bin is an MPS.

[S3a-3M] The prior MPS renormalizing unit 152 captures a value of rMPS output by the LPS/MPS determining unit 13 in step S3a-1 and sets the value as an updated range length CurrRange'. The prior MPS renormalizing unit 152 sets a value of Offset output by the LPS/MPS determining unit 13 in step S3a-1 as an updated offset Offset'.

[S3a-3M] The prior MPS renormalizing unit 152 performs the renormalization processing using the values of CurrRange' and Offset' set in step S3a-3M and calculates a renormalized range length CurrRange" and a renormalized offset Offset". Specific processing of the renormalization processing is explained below.

[S3a-5] When it is determined in step S3a-2 that the symbol of Bin is an LPS, the context-variable calculating unit 14 outputs the symbol corresponding to the LPS as the binary data Bin. On the other hand, when it is determined in step S3a-2 that the input symbol is an MPS, the context-variable calculating unit 14 outputs the symbol corresponding to the MPS as the binary data Bin.

[S3a-6] When it is determined in step S3a-2 that the symbol of Bin is an LPS, the context-variable calculating unit 14 derives, referring to the pStateIdx transition table shown in FIG. 3, transIdxLps, which is pStateIdx to which pStateIdx should be transitions when the symbol corresponding to the LPS is generated, using pStateIdx captured from the context-variable retaining unit 11. The context-variable calculating unit 14 updates the value of pStateIdx retained by the context-variable retaining unit 11 to transIdxLps. pStateIdx after the update is represented as pStateIdx'.

When it is determined that the symbol of Bin is an LPS and when pStateIdx is 0, the context-variable calculating unit 14 updates the value of valMPS retained by the context-variable retaining unit 11 to a bit-inverted value. valMPS after the update is represented as valMPS'. Note that, when it is determined that the symbol of Bin is an LPS and when pStateIdx is other than 0, the context-variable calculating unit 14 sets valMPS as valMPS'.

On the other hand, when it is determined in step S3a-2 that the symbol of Bin is an MPS, the context-variable calculating unit 14 derives, referring to the pStateIdx transition table shown in FIG. 3, transIdxMps, which is pStateIdx to which pStateIdx should be transitioned when the symbol corresponding to the MPS is generated, using pStateIdx captured from the context-variable retaining unit 11. The context-variable calculating unit 14 updates the value of the pStateIdx retained by the context-variable retaining unit 11 to transIdxMps. Note that pStateIdx after the update is also represented as pStateIdx'. When it is determined that the symbol of Bin is an MPS, the context-variable calculating unit 14 sets valMPS as valMPS'.

[S3a-7] The selecting unit 153 determines whether a symbol of Bin to be decoded is an LPS or an MPS from the LPS/MPS determination result output by the LPS/MPS determining unit 13 in step S3-2.

[S3a-8L] When it is determined that the symbol of Bin is an LPS (yes in step S3a-7), the selecting unit 153 outputs the renormalized range length CurrRange" and the renormalized offset Offset" calculated in step S3a-4L to the range-length/offset-variable retaining unit 12 and updates the range length CurrRange and the offset Offset.

[S3a-8M] When it is determined that the symbol of Bin is an MPS (no in step S3a-7), the selecting unit 153 outputs the renormalized range length CurrRange" and the renormalized offset Offset" calculated in step S3a-4M to the range-length/offset-variable retaining unit 12 and updates the range length CurrRange and the offset Offset.

Figure 6:
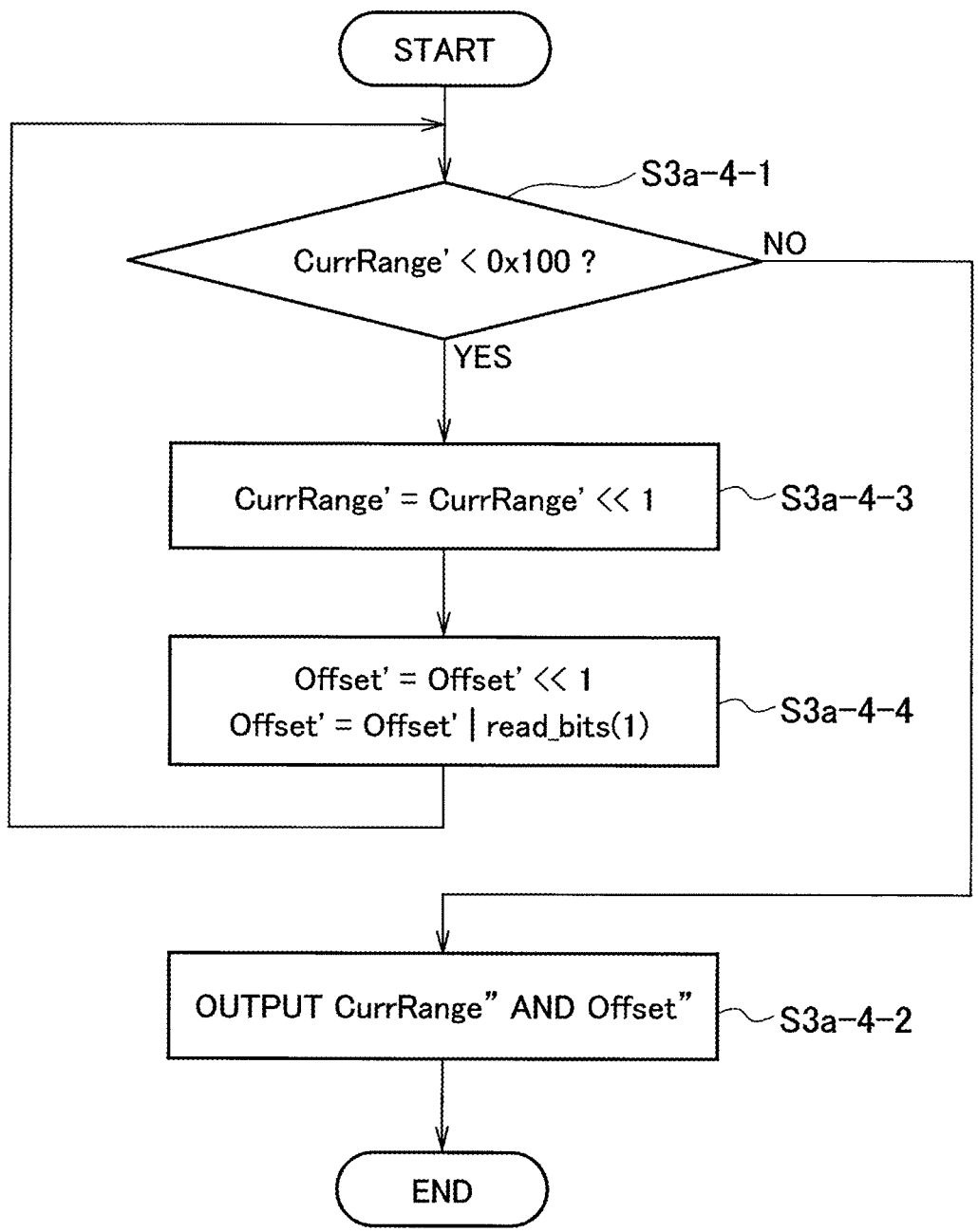
FIG. 6 is a processing flow for explaining detailed processing of steps S3a-4L and S3a-4M in FIG. 5.

FIG. 6 is a processing flowchart for explaining detailed processing of steps S3a-4L and S3a-4M in FIG. 5.

[S3a-4-1] The prior LPS renormalizing unit 151 and the prior MPS renormalizing unit 152 determine whether CurrRange' updated in [S3a-3L] or [S3a-3M] in FIG. 5 is smaller than 0x100 ("0x" indicates that a number following "0x" is a hexadecimal number).

[S3a-4-2] When CurrRange'≥0x100 (no in S3a-4-1), the prior LPS renormalizing unit 151 and the prior MPS renormalizing unit 152 set CurrRange' at the present point in time as the renormalized range length CurrRange". The prior LPS renormalizing unit 151 and the prior MPS renormalizing unit 152 set Offset' at the present point in time as the renormalized offset Offset". That is, when CurrRange' is equal to or larger than 0x100, the prior LPS renormalizing unit 151 and the prior MPS renormalizing unit 152 do not perform the renormalization processing, output CurrRange' to the selecting unit 153 as the renormalized range length CurrRange" and output Offset' to the selecting unit 153 as the renormalized offset Offset", and end the renormalization processing.

[S3a-4-3] When CurrRange'<0x100 (yes in S3a-4-1), the prior LPS renormalizing unit 151 and the prior MPS renormalizing unit 152 one-bit left-shift CurrRange' (equivalent to the processing for doubling CurrRange') and update CurrRange'.

[S3a-4-4] The prior LPS renormalizing unit 151 and the prior MPS renormalizing unit 152 one-bit left-shift Offset' and update Offset with a value obtained by inputting encoded data to a least significant bit (LSB) of Offset' by one bit. The processing returns to the determination processing in step S3a-4-1.

Note that, as shown in FIG. 6, the renormalization processing unit 15 performs processing for repeating a processing loop formed by steps S3a-4-3 and S3a-4-4 (hereinafter referred to as renormalization processing loop as well) until CurrRange' becomes 0x100 or more. The number of times of the repeated renormalization processing loop varies depending on input encoded data and values of pStateIdx, the range length CurrRange, and the like at a point in time when the encoded data is decoded. The processing loop is repeated as many as seven times. For example, in the case of a non-adaptive probability state of pStateIdx=63, an LPS section length is 2 from FIG. 2 and the number of times of the renormalization processing loop is seven. On the other hand, when pStateIdx is 0 to 62 (in the case of an adaptive probability state), a minimum value of the LPS section length is 6 from FIG. 2 and the number of times of the renormalization processing loop is six. In this way, the renormalization processing sometimes requires a long processing time.

The renormalization processing unit 15 of the binary-arithmetic-decoding processing unit 1 according to the first embodiment explained above includes the prior LPS renormalizing unit 151, the prior MPS renormalizing unit 152, and the selecting unit 153. The prior LPS renormalizing unit 151 regards the symbol of Bin as an LPS and performs first renormalization processing in parallel to the LPS/MPS determination processing performed by the LPS/MPS determining unit 13. The prior MPS renormalizing unit 152 regards the symbol of Bin as an MPS and performs second renormalization processing. Note that the first renormalization processing and the second renormalization processing are respectively performed in parallel.

After the LPS/MPS determining unit 13 completes the LPS/MPS determination processing, the selecting unit 153 selects, according to an LPS/MPS determination result, an output (CurrRange" and Offset") from the prior LPS renormalizing unit 151 or an output (CurrRange" and Offset") from the prior MPS renormalizing unit 152, outputs the output to the range-length/offset-variable retaining unit 12, and updates the range length CurrRange and the offset Offset to the range length CurrRange and the offset Offset at the present point in time.

Consequently, in this embodiment, the renormalization processing likely to require a long processing time can be started without waiting for an end of the LPS/MPS determination processing. Consequently, in this embodiment, it is possible to realize an increase in speed and improvement of efficiency of the CABAC decoding processing. That is, compared with the conventional CABAC decoder that performs the renormalization processing after the LPS/MPS determination processing is sequentially completed, in this embodiment, it is possible to realize an increase in speed and improvement of efficiency of the CABAC decoding processing.

Second Embodiment

A CABAC decoder according to a second embodiment of the present invention simultaneously decodes a continuous plurality of binary data Bin1 and Bin2, converts the binary data Bin1 and Bin2 into multi-value data (a syntax element SE), and outputs the multi-value data. The CABAC decoder according to the second embodiment includes a binary-arithmetic-decoding processing unit, a multi-value unit, and a context-index calculating unit as in the configuration disclosed in the first embodiment.

The CABAC decoder according to the second embodiment and the CABAC decoder disclosed in the first embodiment are different in the configuration of the binary-arithmetic-decoding processing unit. The configuration of the binary-arithmetic-decoding processing unit included in the CABAC decoder according to the second embodiment is explained in detail below with reference to the drawings.

Configuration of the Binary-Arithmetic-Decoding Processing Unit

Figure 7:
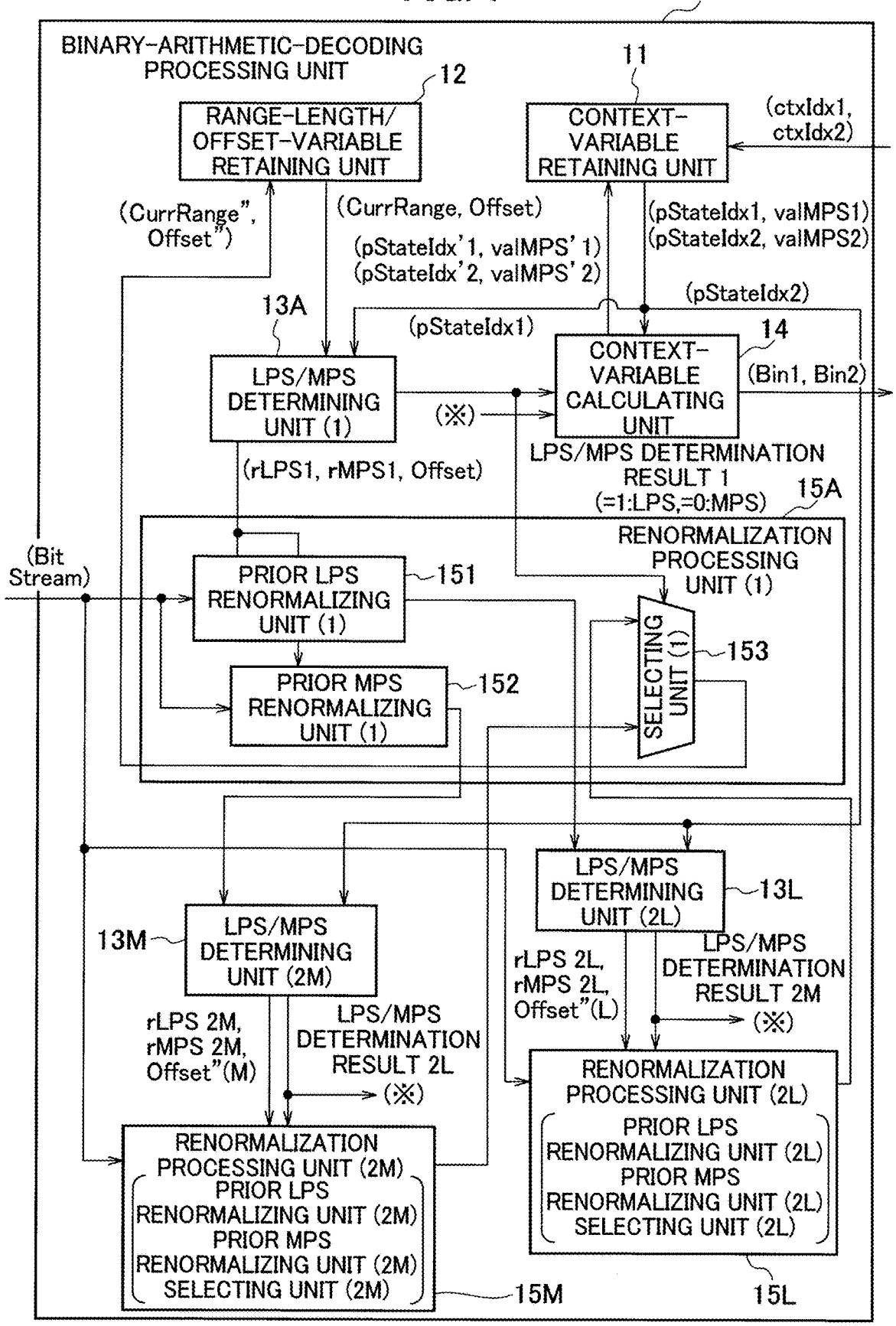
FIG. 7 is a diagram showing the configuration of a CABAC decoder according to a second embodiment.

FIG. 7 is a diagram for explaining the configuration of a binary-arithmetic-decoding processing unit 1A included in the CABAC decoder according to the second embodiment of the present invention. The binary-arithmetic-decoding processing unit 1A shown in FIG. 7 includes an LPS/MPS determining unit (1) 13A, an LPS/MPS determining unit (2L) 13L, an LPS/MPS determining unit (2M) 13M, a renormalization processing unit (1) 15A, a renormalization processing unit (2L) 15L, a renormalization processing unit (2M) 15M, the context-variable calculating unit 14, the context-variable retaining unit 11, and the range-length/offset-variable retaining unit 12.

The configurations, processing, and a connection form of the range-length/offset-variable retaining unit 12, the context-variable retaining unit 11, the LPS/MPS determining unit (1) 13A, and the context-variable calculating unit 14 shown in FIG. 7 are substantially the same as the configurations, the processing, and the connection form of the range-length/offset-variable retaining unit 12, the context-variable retaining unit 11, the LPS/MPS determining unit 13, and the context-variable calculating unit 14 shown in FIG. 1 explained in the first embodiment.

However, the context-variable retaining unit 11 in this embodiment is different in that two continuous context indexes ctxIdx1 and ctxIdx2 output by a context-index calculating unit (not shown in FIG. 7) are input to the context-variable retaining unit 11 and the context-variable retaining unit 11 retains values of pStateIdx1 and valMPS1 and pStateIdx2 and valMPS2 respectively corresponding to the context indexes ctxIdx1 and ctxIdx2.

The LPS/MPS determining unit (1) 13A performs, using pStateIdx1 retained by the context-variable retaining unit 11, determination processing (LPS/MPS determination) for determining whether a symbol of first binary data Bin1 to be decoded is an LPS or an MPS.

The context-variable calculating unit 14 derives continuous two binary data Bin1 and Bin2 using a determination result of the LPS/MPS determining unit (1) 13A and a determination result of an LPS/MPS determining unit (2L) 13L or a determination result of an LPS/MPS determining unit (2M) 13M. The context-variable calculating unit 14 updates pStateIdx2 and valMPS2 according to the determination result of the LPS/MPS determining unit (1) 13A and the determination result of the LPS/MPS determining unit (2L) 13L or the determination result of the LPS/MPS determining unit (2M) 13M.

Like the renormalization processing unit 15 shown in FIG. 1, the renormalization processing unit (1) 15A shown in FIG. 7 includes a prior LPS renormalizing unit (1) 151, a prior MPS renormalizing unit (1) 152, and a selecting unit (1) 153. However, a connection form of these units is different. Specifically, the renormalization processing unit (1) 15A is different from the renormalization processing unit 15 shown in FIG. 1 in that the prior LPS renormalizing unit (1) 151 is connected such that an output (a renormalized range length and a renormalized offset) of the prior LPS renormalizing unit (1) 151 is input to the LPS/MPS determining unit (2L) 13L explained below. The renormalization processing unit (1) 15A is different from the renormalization processing unit 15 shown in FIG. 1 in that the prior MPS renormalizing unit (1) 152 is connected such that an output (a renormalized range length and a renormalized offset) of the prior MPS renormalizing unit (1) 152 is input to the LPS/MPS determining unit (2M) 13M explained below. Further, the renormalization processing unit (1) 15A is different from the renormalization processing unit 15 shown in FIG. 1 in that the selecting unit (1) 153 is connected such that an output (a renormalized range length and a renormalized offset) of the renormalization processing unit (2L) 15L explained below and an output (a renormalized range length and a renormalized offset) of the renormalized processing unit (2M) 15M explained below are input to the selecting unit (1) 153.

The LPS/MPS determining unit (2L) 13L and the LPS/MPS determining unit (2M) 13M shown in FIG. 7 have the same configuration as the configuration of the LPS/MPS determining unit 13 shown in FIG. 1 (or the LPS/MPS determining unit (1) 13A) and perform the same processing as the processing of the LPS/MPS determining unit 13 (or the LPS/MPS determining unit (1) 13A). Specifically, the LPS/MPS determining unit (2L) 13L determines whether second binary data Bin2 following Bin1 is an LPS or an MPS using pStateIdx2 of a context variable and a range length and an offset renormalized by the prior LPS renormalizing unit (1) 151 and outputs a result of the determination. The LPS/MPS determining unit (2M) 13M determines whether the second binary data Bin2 is a LPS or an MPS using pStateIdx2 of a context variable and a range length and an offset renormalized by the prior MPS renormalizing unit (1) 152 and outputs a result of the determination.

The renormalization processing unit (2L) 15L and the renormalization processing unit (2M) 15M shown in FIG. 7 have the same configuration as the configuration of the renormalization processing unit 15 shown in FIG. 1 and perform the same processing as the processing of the renormalization processing unit 15.

Specifically, the renormalization processing unit (2L) 15L includes a prior LPS renormalizing unit (2L), a prior MPS renormalizing unit (2L), and a selecting unit (2L). The renormalization processing unit (2M) 15M includes a prior LPS renormalizing unit (2M), a prior MPS renormalizing unit (2M), and a selecting unit (2M).

The prior LPS renormalizing unit (2L) and the prior LPS renormalizing unit (2M) have the same configuration as the configuration of the prior LPS renormalizing unit 151 shown in FIG. 1 (or the prior LPS renormalizing unit (1) 151 shown in FIG. 7) and perform the same processing as the processing of the prior LPS renormalizing unit 151 (or the prior LPS renormalizing unit (1) 151). That is, the prior LPS renormalizing unit (2L) and the prior LPS renormalizing unit (2M) regard the symbol of Bin2 as an LPS and perform the renormalization processing. The prior MPS renormalizing unit (2L) and the prior MPS renormalizing unit (2M) have the same configuration as the configuration of the prior MPS renormalizing unit 152 shown in FIG. 1 (or the prior MPS renormalizing unit (1) 152 shown in FIG. 7) and perform the same processing as the prior MPS renormalizing unit 152 (or the prior MPS renormalizing unit (1) 152). That is, the prior MPS renormalizing unit (2L) and the prior MPS renormalizing unit (2M) regard the symbol of Bin2 as an MPS and perform the renormalization processing. The selecting unit (2L) and the selecting unit (2M) have the same configuration as the configuration of the selecting unit 153 shown in FIG. 1 (or the selecting unit (1) 153 shown in FIG. 7) and perform the same processing as the processing of the selecting unit 153 (or the selecting unit (1) 153).

Operation of the CABAC Decoder

The CABAC decoder according to the second embodiment performs processing similar to the processing of the CABAC decoder according to the first embodiment explained with reference to FIG. 4. However, processing in step S3 performed by the binary-arithmetic-decoding processing unit 1A is different. A processing flow of the binary-arithmetic-decoding processing unit 1A according to the second embodiment is explained below with reference to FIGS. 8A to 8C.

Figure 8A:
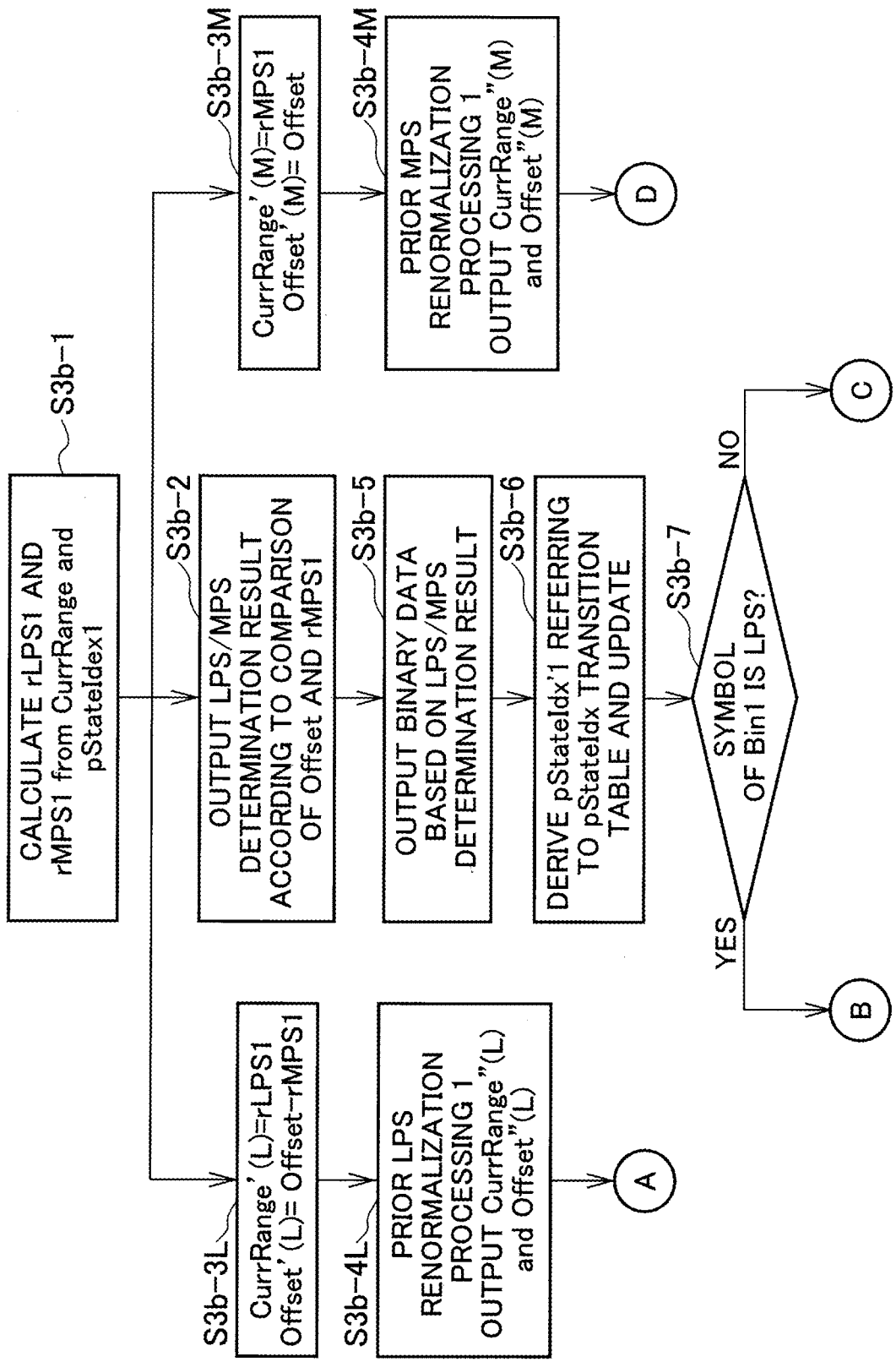
FIG. 8A is a processing flow for explaining detailed processing of step S3 in FIG. 4 in the second embodiment.
Figure 8B:
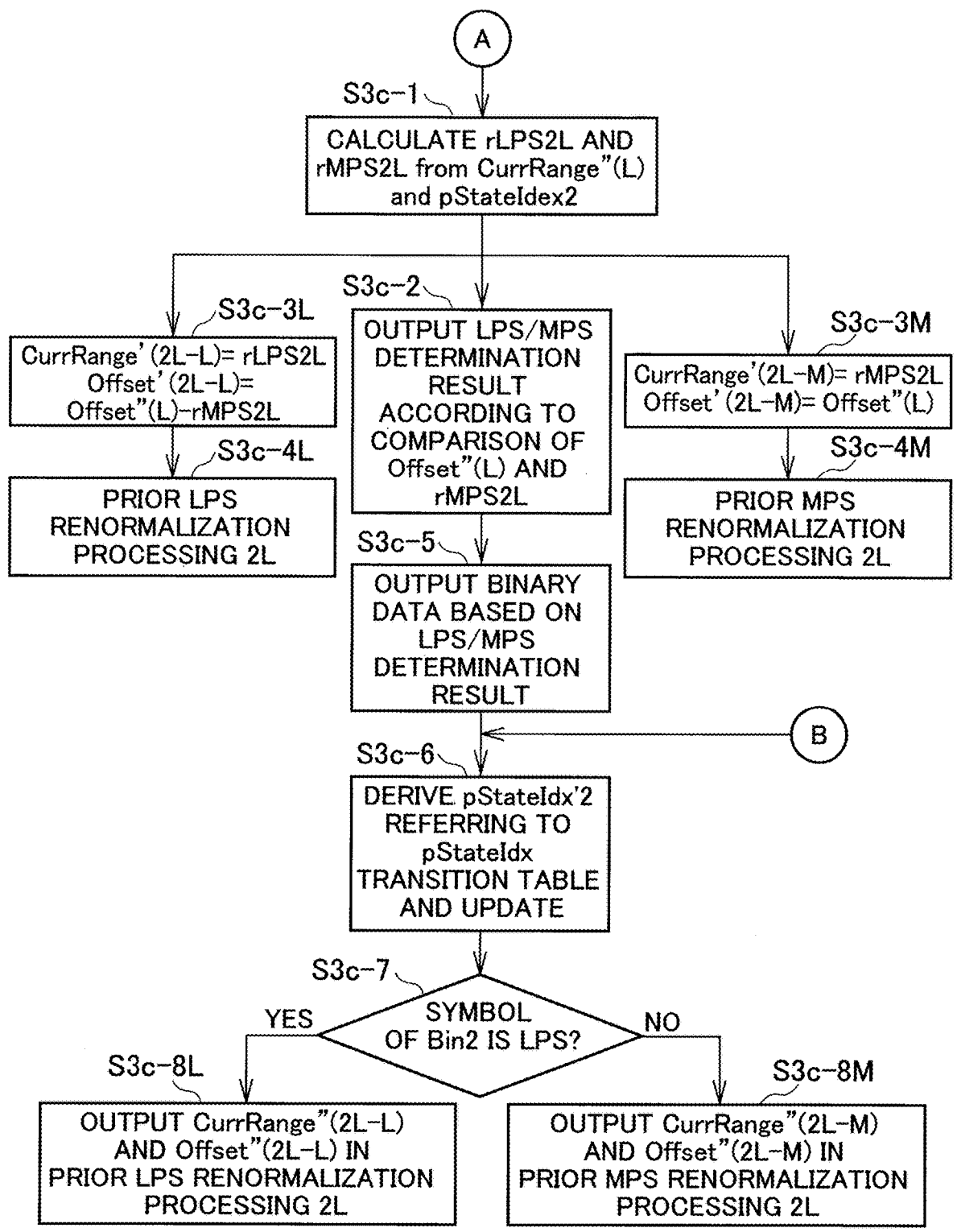
FIG. 8B is a processing flow for explaining the detailed processing of step S3 in FIG. 4 in the second embodiment.
Figure 8C:
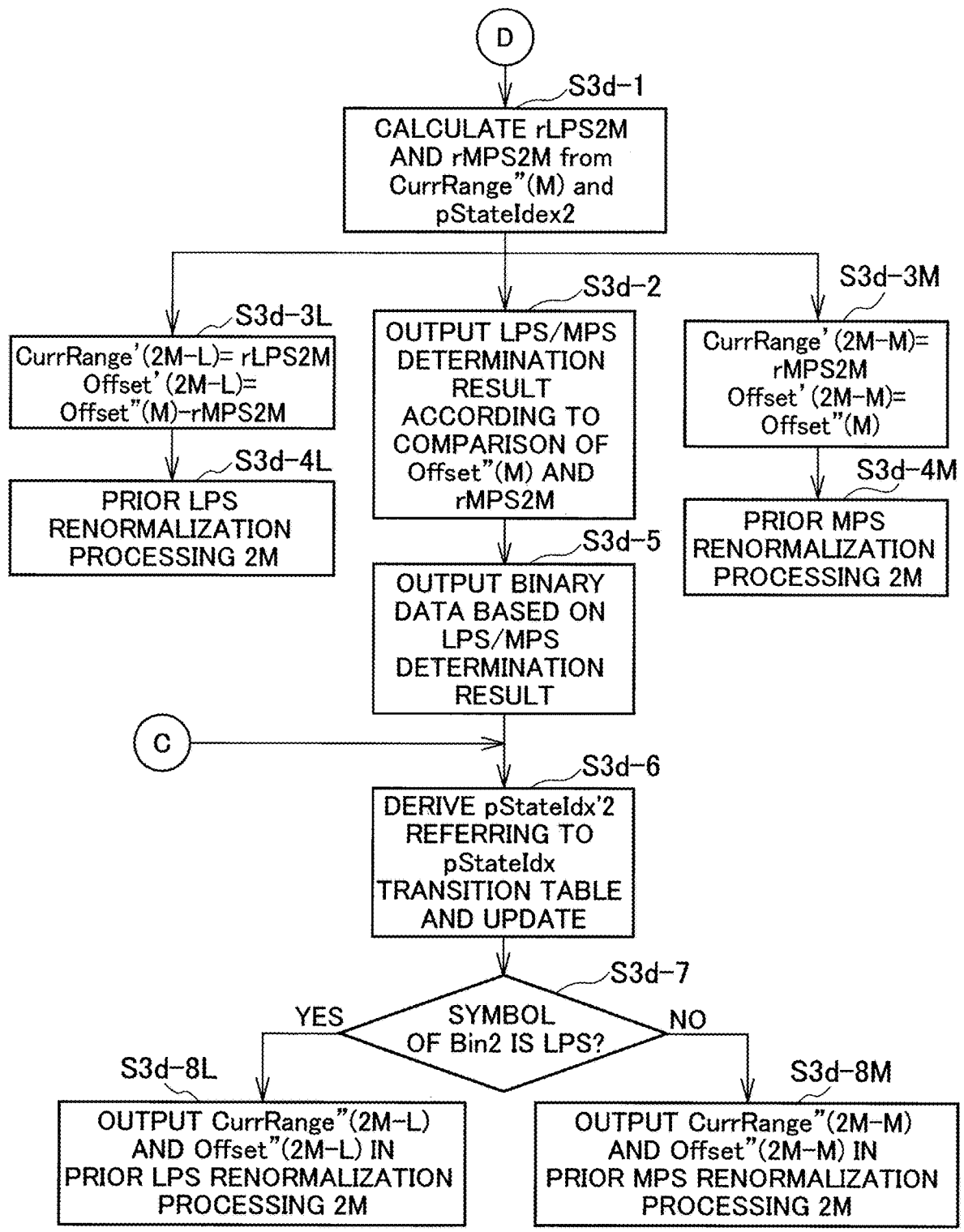
FIG. 8C is a processing flow for explaining the detailed processing of step S3 in FIG. 4 in the second embodiment.

FIGS. 8A, 8B, and 8C are diagrams for explaining detailed processing of step S3 in FIG. 4 and are also diagrams for explaining the processing flow of the binary-arithmetic-decoding processing unit 1A shown in FIG. 7.

Determination Processing for First Binary Data: FIG. 8A

[S3b-1] The LPS/MPS determining unit (1) 13A captures a range length CurrRange and an offset Offset at the present point in time retained by the range-length/offset-variable retaining unit 12 and captures pStateIdx1 retained by the context-variable retaining unit 11. The LPS/MPS determining unit (1) 13A derives, referring to the LPS section length table shown in FIG. 2, an LPS section length rLPS1 from qRangeIdx and pStateIdx1 indicating 2 bits of [7:6] among total 9 bits [8:0] of the captured CurrRange. The LPS/MPS determining unit (1) 13A subtracts the LPS section length from the range length at the present point in time (CurrRange−rLPS1) to calculate an MPS section length rMPS1. The LPS/MPS determining unit (1) 13A outputs rLPS1, rMPS1, and Offset to the renormalization processing unit (1) 15A.

[S3b-2] The LPS/MPS determining unit (1) 13A compares sizes of the MPS section length rMPS1 and Offset and determines whether a symbol of the first binary data Bin1 to be decoded is an LPS or an MPS. When rMPS1 is larger than Offset, the LPS/MPS determining unit (1) 13A determines that the symbol of Bin1 is an MPS and outputs a bit 0 to the selecting unit (1) 153 of the renormalization processing unit (1) 15A as an LPS/MPS determination result 1. On the other hand, when rMPS1 is smaller than or equal to Offset, the LPS/MPS determining unit (1) 13A determines that the symbol of Bin1 is an LPS and outputs a bit 1 to the selecting unit (1) 153 of the renormalization processing unit (1) 15A as the LPS/MPS determination result 1.

[S3b-3L to S3b-4L] Processing in step S3b-3L to step S3b-4L is performed independently from and in parallel to step S3b-2. Steps S3b-3L to S3b-4L are processing for performing renormalization processing assuming that the symbol of Bin1 is an LPS.

[S3b-3L] The prior LPS renormalizing unit (1) 151 captures a value of rLPS1 output by the LPS/MPS determining unit (1) 13A in step S3b-1 and sets the value as an updated range length CurrRange' (L). The prior LPS renormalizing unit (1) 151 captures values of rMPS1 and Offset output by the LPS/MPS determining unit 13 in step S3b-1 and sets a value obtained by subtracting rMPS1 from Offset (Offset−rMPS1) as an updated offset Offset' (L).

[S3b-4L] The prior LPS renormalizing unit (1) 151 performs the renormalization processing using values of CurrRange' (L) and Offset' (L) set in step S3b-3L and calculates a renormalized range length CurrRange" (L) and a renormalized offset Offset"(L). A specific processing flow of the renormalization processing is the same as the processing flow of the processing shown in FIG. 6.

[S3b-3M to S3b-4M] Processing in step S3b-3M to step S3b-4M is performed independently from and in parallel to step S3b-2 and performed independently from and in parallel to the processing in step S3b-3L to step S3b-4L. Steps S3b-3M to S3b-4M are processing for performing the renormalization processing assuming that the symbol of Bin1 is an MPS.

[S3b-3M] The prior MPS renormalizing unit (1) 152 captures a value of rMPS1 output by the LPS/MPS determining unit (1) 13A in step S3b-1 and sets the value as an updated range length CurrRange' (M). The prior MPS renormalizing unit (1) 152 captures a value of Offset output by the LPS/MPS determining unit (1) 13A in step S3b-1 and sets the value as an updated offset Offset' (M).

[S3b-4M] The prior MPS renormalizing unit (1) 152 performs the renormalization processing using the values of CurrRange' (M) and Offset' (M) set in step S3b-3M and calculates a renormalized range length CurrRange" (M) and a renormalized offset Offset" (M). A specific processing flow of the renormalization processing is the same as the processing flow of the processing shown in FIG. 6.

Determination Processing for the Second Binary Data (Assuming that the Symbol of the First Binary Data is a LPS): FIG. 8B The LPS/MPS determining unit (2L) 13L performs, based on the premise that the symbol of Bin1 is an LPS, LPS/MPS determination of a symbol of second binary data Bin2 following Bin1.

[S3c-1] The LPS/MPS determining unit (2L) 13L captures the range length CurrRange" (L) and the offset Offset" (L) renormalized by the prior LPS renormalizing unit (1) 151 and captures pStateIdx2 retained by the context-variable retaining unit 11. The LPS/MPS determining unit (2L) 13L derives, referring to the LPS section length table shown in FIG. 2, an LPS section length rLPS2L from qRangeIdx and pStateIdx2 indicating 2 bits of [7:6] among total 9 bits [8:0] of the captured CurrRange" (L). The LPS/MPS determining unit (2L) 13L subtracts the LPS section length from the range length at the present point in time (CurrRange" (L)−rLPS2L) to calculate an MPS section length rMPS2L. The LPS/MPS determining unit (2L) 13L outputs rLPS2L, rMPS2L, and Offset" (L) to the renormalization processing unit (2L) 15L.

[S3c-2] The LPS/MPS determining unit (2L) 13L compares sizes of the MPS section length rMPS2L and Offset"

(L) and performs determination processing for determining whether a symbol of the second binary data Bin2 to be decoded is an LPS or an MPS. When rMPS2L is larger than Offset" (L), the LPS/MPS determining unit (2L) 13L determines that the symbol of Bin2 is an MPS and outputs a bit 0 to the selecting unit (2L) of the renormalization processing unit (2L) 15L as an LPS/MPS determination result 2L. On the other hand, when rMPS2L is smaller than or equal to Offset" (L), the LPS/MPS determining unit (2L) 13L determines that the symbol of Bin2 is an LPS and outputs a bit 1 to the selecting unit (2L) of the renormalization processing unit (2L) 15L as the LPS/MPS determination result 2L. The LPS/MPS determination result 2L of the symbol of Bin2 by the LPS/MPS determining unit (2L) 13L is output to the context-variable calculating unit 14 as well.

[S3c-3L to S3c-4L] The renormalization processing unit (2L) 15L performs the same processing as the renormalization processing (steps S3b-3L to S3b-4L) in the determination processing for the first binary data. Detailed explanation of the steps is omitted. Note that the renormalization processing unit (2L) 15L performs the renormalization processing using rLPS2L, rMPS2L, and Offset" (L) output by the LPS/MPS determining unit (2L) 13L. The renormalization processing unit (2L) 15L outputs a renormalized range length CurrRange" (2L-L) and a renormalized offset Offset" (2L-L) to the selecting unit (1) 153 included in the renormalization processing unit (1) 15A.

[S3c-3M to S3c-4M] The renormalization processing unit (2L) 15L performs the same processing as the renormalization processing (steps S3b-3M to S3b-4M) in the determination processing for the first binary data. Detailed explanation of the steps is omitted. Note that the renormalization processing unit (2L) 15L performs the renormalization processing using rLPS2L, rMPS2L, and Offset" (L) output by the LPS/MPS determining unit (2L) 13L. The renormalization processing unit (2L) 15L outputs a renormalized range length CurrRange" (2L-M) and a renormalized offset Offset" (2L-M) to the selecting unit (1) 153 included in the renormalization processing unit (1) 15A.

Determination Processing for the Second Binary Data (Assuming that the Symbol of the First Binary Data is an MPS): FIG. 8C The LPS/MPS determining unit (2M) 13M performs, based on the premise that the symbol of Bin1 is an MPS, LPS/MPS determination of a symbol of the second binary data Bin2 following Bin1.

[S3d-1] The LPS/MPS determining unit (2M) 13M captures the range length CurrRange" (M) and the offset Offset" (M) renormalized by the prior MPS renormalizing unit (1) 152 and captures pStateIdx2 retained by the context-variable retaining unit 11. The LPS/MPS determining unit (2M) 13M derives, referring to the LPS section length table shown in FIG. 2, an LPS section length rLPS2M from qRangeIdx and pStateIdx2 indicating 2 bits of [7:6] among total 9 bits [8:0] of the captured CurrRange" (M). The LPS/MPS determining unit (2M) 13M subtracts the LPS section length from the range length at the present point in time (CurrRange" (M)−rLPS2M) to calculate an MPS section length rMPS2M. The LPS/MPS determining unit (2M) 13M outputs rLPS2M, rMPS2M, and Offset" (M) to the renormalization processing unit (2M) 15M.

[S3d-2] The LPS/MPS determining unit (2M) 13M compares sizes of the MPS section length rMPS2M and Offset" (M) and performs determination processing for determining whether a symbol of the second binary data Bin2 to be decoded is an LPS or an MPS. When rMPS2M is larger than Offset" (M), the LPS/MPS determining unit (2M) 13M determines that the symbol of Bin2 is an MPS and outputs a bit 0 to the selecting unit (2M) of the renormalization processing unit (2M) 15M as an LPS/MPS determination result 2M. On the other hand, when rMPS2M is smaller than or equal to Offset" (M), the LPS/MPS determining unit (2M) 13M determines that the symbol of Bin2 is an LPS and outputs a bit 1 to the selecting unit (2M) of the renormalization processing unit (2M) 15M as the LPS/MPS determination result 2M. The MPS/MPS determination result 2M of the symbol of Bin2 by the LPS/MPS determining unit (2M) 13M is output to the context-variable calculating unit 14 as well.

[S3d-3L to S3d-4L] The renormalization processing unit (2M) 15M performs the same processing as the renormalization processing(steps S3b-3L to S3b-4L) in the determination processing for the first binary data. Detailed explanation of the steps is omitted. Note that the renormalization processing unit (2M) 15M performs the renormalization processing using rLPS2M, rMPS2M, and Offset" (M) output by the LPS/MPS determining unit (2M) 13M. The renormalization processing unit (2M) 15M outputs a renormalized range length CurrRange" (2M-L) and a renormalized offset Offset" (2M-L) to the selecting unit (1) 153 included in the renormalization processing unit (1) 15A.

[S3d-3M to S3d-4M] The renormalization processing unit (2M) 15M performs the same processing as the renormalization processing(steps S3b-3M to S3b-4M) in the determination processing for the first binary data. Detailed explanation of the steps is omitted. Note that the renormalization processing unit (2M) 15M performs the renormalization processing using rLPS2M, rMPS2M, and Offset" (M) output by the LPS/MPS determining unit (2M) 13M. The renormalization processing unit (2M) 15M outputs a renormalized range length CurrRange" (2M-M) and a renormalized offset Offset" (2M-M) to the selecting unit (1) 153 included in the renormalization processing unit (1) 15A.

Binary Data Output Processing: FIGS. 8A, 8B, and 8C

[S3b-5] When it is determined based on the LPS/MPS determination result output by the LPS/MPS determining unit (1) 13A that the symbol of the first binary data to be decoded in an LPS, the context-variable calculating unit 14 outputs the symbol corresponding to the LPS as first binary data Bin1. When it is determined that the symbol of the first binary data is an MPS, the context-variable calculating unit 14 outputs the symbol corresponding to the MPS as the first binary data Bin1.

[S3c-5] When the LPS/MPS determination result 1 indicates an LPS, the context-variable calculating unit 14 adopts the LPS/MPS determination result 2L as an LPS/MPS determination result for the second binary data. When it is determined based on the adopted LPS/MPS determination result 2L that the symbol of the second binary data to be decoded is an LPS, the context-variable calculating unit 14 outputs the symbol corresponding to the LPS as the second binary data Bin2. When it is determined that the symbol of the second binary data is an MPS, the context-variable calculating unit 14 outputs the symbol corresponding to the MSP as the second binary data Bin2.

[S3d-5] When the LPS/MPS determination result 1 indicates an MPS, the context-variable calculating unit 14 adopts the LPS/MPS determination result 2M as the LPS/MPS determination result for the second binary data. When it is determined based on the adopted LPS/MPS determination result 2M that the symbol of the second binary data to be decoded is an LPS, the context-variable calculating unit 14 outputs the symbol corresponding to the LPS as the second binary data Bin2. When it is determined that the symbol of the second binary data is an MPS, the context-variable calculating unit 14 outputs the symbol corresponding to the MSP as the second binary data Bin2.

Variable Update Processing for the First Binary Data: FIG. 8A

[S3b-6] The context-variable calculating unit 14 performs processing similar to step S3a-6 in FIG. 5. That is, the context-variable calculating unit 14 updates, referring to the pStateIdx transition table shown in FIG. 3, pStateIdx1 to pStateIdx'1 according to the LPS/MPS determination result 1 of the first binary data and updates the value valMPS1 of the MPS to valMPS'1.

[S3b-7] The selecting unit (1) 153 of the renormalization processing unit (1) 15A determines from the LPS/MPS determination result 1 output by the LPS/MPS determining unit (1) 13A whether the symbol of the first binary data is an LPS or a MPS.

Variable Update Processing for the Second Binary Data (When the Symbol of the First Binary Data is an LPS: FIG. 8B

[S3c-6] When the first binary data is a LPS, as in S3b-6, the context-variable calculating unit 14 updates pStateIdx2 to pStateIdx'2 according to the LPS/MPS determination result 2L of the second binary data and updates the value valMPS2 of the MPS to valMPS'2.

[S3c-7] The selecting unit (2L) of the renormalization processing unit (2L) 15L determines from the LPS/MPS determination result 2L output by the LPS/MPS determining unit (2L) 13L whether the symbol of the second binary data is an LPS or a MPS.

[S3c-8L] When it is determined that the symbol of the first binary data is an LPS and when it is determined that the symbol of the second binary data is an LPS, the selecting unit (1) 153 of the renormalization processing unit (1) 15A outputs the renormalized range length CurrRange" (2L-L) and the renormalized offset Offset" (2L-L) calculated by the prior LPS renormalizing unit (2L) of the renormalization processing unit (2L) 15L to the range-length/offset-variable retaining unit 12 and updates the range length CurrRange and the offset Offset.

[S3c-8M] When it is determined that the symbol of the first binary data is an LPS and when it is determined that the symbol of the second binary data is an MPS, the selecting unit (1) 153 of the renormalization processing unit (1) 15A outputs the renormalized range length CurrRange" (2L-M) and the renormalized offset Offset" (2L-M) calculated by the prior MPS renormalizing unit (2L) of the renormalization processing unit (2L) 15L to the range-length/offset-variable retaining unit 12 and updates the range length CurrRange and the offset Offset.

Variable Update Processing for the Second Binary Data (When the Symbol of the First Binary Data is a MPS): FIG. 8C

[S3d-6] When the first binary data is an MPS, as in S3b-6, the context-variable calculating unit 14 updates pStateIdx2 to pStateIdx'2 according to the LPS/MPS determination result 2M of the second binary data and updates the value valMPS2 of the MPS to valMPS'2.

[S3d-7] The selecting unit (2M) of the renormalization processing unit (2M) 15M determines from the LPS/MPS determination result 2M output by the LPS/MPS determining unit (2M) 13M whether the symbol of the second binary data is an LPS or a MPS.

[S3d-8L] When it is determined that the symbol of the first binary data is an MPS and when it is determined that the symbol of the second binary data is a LPS, the selecting unit (1) 153 of the renormalization processing unit (1) 15A outputs the renormalized range length CurrRange" (2M-L) and the renormalized offset Offset" (2M-L) calculated by the prior LPS renormalizing unit (2M) of the renormalization processing unit (2M) 15M to the range-length/offset-variable retaining unit 12 and updates the range length CurrRange and the offset Offset.

[S3d-8M] When it is determined that the symbol of the first binary data is an MPS and when it is determined that the symbol of the second binary data is an MPS, the selecting unit (1) 153 of the renormalization processing unit (1) 15A outputs the renormalized range length CurrRange" (2M-M) and the renormalized offset Offset" (2M-M) calculated by the prior MPS renormalizing unit (2M) of the renormalization processing unit (2M) 15M to the range-length/offset-variable retaining unit 12 and updates the range length CurrRange and the offset Offset.

With the binary-arithmetic-decoding processing unit 1A included in the CABAC decoder according to this embodiment explained above, it is possible to start the renormalization processing without waiting for an end of the LPS/MPS determination processing for the first binary data to be decoded. It is possible to start the renormalization processing without waiting for an end of the LPS/MPS determination processing for the second binary data following the first binary data. That is, in this embodiment, it is possible to carry out the CABAC decoding processing at high speed and high efficiency by simultaneously decoding a continuous plurality of binary data, converting the binary data into multi-value data, and outputting the multi-value data.

Note that the binary-arithmetic-decoding processing units 1 and 1A, the multi-value unit 2, and the context-index calculating unit 3 included in the CABAC decoder according to the first embodiment and the second embodiment may be individual/integrated hardware resources capable of executing processing respectively corresponding to the units. The hardware resources may be, for example, an LSI (Large Scale Integrated Circuit), an ASIC (Application Specific Integrated Circuit), or an FPGA (Field-Programmable Gate Array). The CABAC decoder according to the first embodiment and the second embodiment may be a computer system including a CPU (Central Processing Unit), a memory, an external storage device such as a hard disk, an input device, and an output device. In the computer system, the CPU executes predetermined programs loaded onto the memory, whereby predetermined functions are realized. For example, the functions of the binary-arithmetic-decoding processing units 1 and 1A, the multi-value unit 2, and the context-index calculating unit 3 are respectively realized by the CPU executing a program for the binary-arithmetic-decoding processing units 1 and 1A, a program for the multi-value unit 2, and a program for the context-index calculating unit 3. The program for the binary-arithmetic-decoding processing units 1 and 1A, the program for the multi-value unit 2, and the program for the context-index calculating unit 3 can be stored in a computer-readable recording medium such as a hard disk, a flexible disk, a CD-ROM, an MO, or a DVD-ROM or can be distributed via a network.

Note that the present invention is not limited to the embodiments explained above and various modifications are possible within the scope of the gist of the present invention.

EXPLANATION OF THE REFERENCE NUMERALS 1, 1A binary-arithmetic-decoding processing unit
11 context-variable retaining unit
12 range-length/offset-variable retaining unit
13, 13A, 13L, 13M LPS/MPS determining unit
14 context-variable calculating unit
15, 15A, 15L, 15M renormalization processing unit
151 prior LPS renormalizing unit
152 prior MPS renormalizing unit
153 selecting unit

The invention claimed is:

1. A binary arithmetic decoder comprising:
a binary-arithmetic-decoding processing unit that decodes input encoded data into binary data and outputs the binary data;
a multi-value unit that converts the binary data output by the binary-arithmetic-decoding processing unit into multi-value data and outputs the multi-value data; and
a context-index calculating unit that derives a context index based on the decoded binary data and the multi-value data and outputs the context index to the binary-arithmetic-decoding processing unit, wherein
the binary-arithmetic-decoding processing unit includes:
a context-variable retaining unit that derives, based on the context index output from the context-index calculating unit, a first context variable included a first probability state index representing a code occurrence probability and a value of a first superior probability code having a high occurrence probability and retains the first context variable;
a range-length/offset-variable retaining unit that retains a range length indicating an entire section length in a real number section of an occurrence probability and an offset indicating a present position in the range length;
a first LPS/MPS determining unit that determines, using the first probability state index, the range length, and the offset, whether a code of first binary data is an inferior probability code or a superior probability code and outputs a result of the determination;
a first renormalization processing unit that performs renormalization processing on the range length and the offset; and
a context-variable calculating unit that derives the first binary data using the first context variable and the determination result and outputs the first binary data to the multi-value unit, and
the first renormalization processing unit:
in parallel to determination processing of the first LPS/MPS determining unit, regards the code of the first binary data as the inferior probability code, updates the range length and the offset, and performs first renormalization processing on the range length and the offset after the update until the range length after the update becomes a predetermined section length or more,
in parallel to the determination processing of the first LPS/MPS determining unit, regards the code of the first binary data as the superior probability code, updates the range length and the offset, and performs second renormalization processing on the range length and the offset after the update until the range length after the update becomes a predetermined section length or more, and
selects, according to the determination result, the range length and the offset after renormalization by the first renormalization processing or the range length and the offset after renormalization by the second renormalization processing and outputs the range length and the offset to the range-length/offset-variable retaining unit,
wherein the first renormalization processing and the second renormalization processing operate in parallel to each other.

2. The binary arithmetic decoder according to claim 1, wherein the first renormalization processing unit includes:
a first renormalizing unit that performs the first renormalization processing;
a second renormalizing unit that performs the second renormalization processing; and
a selecting unit that selects, according to the determination result output by the first LPS/MPS determining unit, the range length and the offset after the renormalization by the first renormalization processing or the range length and the offset after the renormalization by the second renormalization processing.

3. The binary arithmetic decoder according to claim 2, wherein
the context-variable retaining unit derives, based on the context index output from the context-index calculating unit, a second context variable included a second probability state index and a value of a second superior probability code and retains the second context variable,
the binary-arithmetic-decoding processing unit further includes:
a second LPS/MPS determining unit that determines, using the second probability state index and the range length and the offset renormalized by the first renormalizing unit, whether a code of second binary data following the first binary data is the inferior probability code or the superior probability code and outputs a result of the determination;
a second renormalization processing unit that regards the code of the second binary data as the inferior probability code and performs renormalization processing on the range length and the offset renormalized by the first renormalizing unit, and regards the code of the second binary data as the superior probability code and performs renormalization processing on the range length and the offset renormalized by the first renormalizing unit;
a third LPS/MPS determining unit that determines, using the second probability state index and the range length and the offset renormalized by the second renormalizing unit, whether the code of the second binary data is the inferior probability code or the superior probability code and outputs a result of the determination; and
a third renormalization processing unit that regards the code of the second binary data as the inferior probability code and performs renormalization processing on the range length and the offset renormalized by the second renormalizing unit, and regards the code of the second binary data as the superior probability code and performs renormalization processing on the range length and the offset renormalized by the second renormalizing unit, and the context-variable calculating unit derives the second binary data using the determination result of the first LPS/MPS determining unit and using the determination result of the second LPS/MPS determining unit or the determination result of the third LPS/MPS determining unit, and updates the second context variable according to the determination result of the first LPS/MPS determining unit and to the determination result of the second LPS/MPS determining unit or the determination result of the third LPS/MPS determining unit.

4. A binary arithmetic decoding device that decodes input encoded data into binary data and outputs the binary data, the binary arithmetic decoding device comprising:

a first LPS/MPS determining unit that determines, using a first context variable, a range length indicating an entire section length in real number section of an occurrence probability, and an offset indicating a present position in the range length, whether a code of first binary data is an inferior probability code or a superior probability code and outputs a result of the determination;

a first renormalization processing unit that performs renormalization processing on the range length and the offset; and a context-variable calculating unit that derives the first binary data using the determination result and updates the first context variable according to the determination result, wherein the first renormalization processing unit includes:

a first renormalizing unit that, in parallel to determination processing of the first LPS/MPS determining unit, regards the code of the first binary data as the inferior probability code and performs renormalization processing;

a second renormalizing unit that, in parallel to the determination processing of the first LPS/MPS determining unit, regards the code of the first binary data as the superior probability code and performs renormalization processing; and a selecting unit that selects, according to the determination result, the range length and the offset after the renormalization by the first renormalizing unit or the range length and the offset after the renormalization by the second renormalizing unit and the selected range length and offset, wherein the renormalization processing performed by the first renormalizing unit and the renormalization processing performed by second renormalization unit are performed in parallel with each other.

5. The binary arithmetic decoding device according to claim 4, further comprising:

a second LPS/MPS determining unit that determines, using a second context variable and the range length and the offset renormalized by the first renormalizing unit, whether a code of second binary data following the first binary data is the inferior probability code or the superior probability code and outputs a result of the determination;

a second renormalization processing unit that regards the code of the second binary data as the inferior probability code and performs renormalization processing on the range length and the offset renormalized by the first renormalizing unit, and regards the code of the second binary data as the superior probability code and performs renormalization processing on the range length and the offset renormalized by the first renormalizing unit;

a third LPS/MPS determining unit that determines, using the second context variable and the range length and the offset renormalized by the second renormalizing unit, whether the code of the second binary data is the inferior probability code or the superior probability code and outputs a result of the determination; and a third renormalization processing unit that regards the code of the second binary data as the inferior probability code and performs renormalization processing on the range length and the offset renormalized by the second renormalizing unit, and regards the code of the second binary data as the superior probability code and performs renormalization processing on the range length and the offset renormalized by the second renormalizing unit, wherein the context-variable calculating unit derives the second binary data using the determination result of the first LPS/MPS determining unit and using the determination result of the second LPS/MPS determining unit or the determination result of the third LPS/MPS determining unit, and updates the second context variable according to the determination result of the first LPS/MPS determining unit and to the determination result of the second LPS/MPS determining unit or the determination result of the third LPS/MPS determining unit.

\* \* \* \* \*